US010349539B2

(12) United States Patent
Reynoso Galvan et al.

(10) Patent No.: US 10,349,539 B2
(45) Date of Patent: Jul. 9, 2019

(54) VEHICLE ELECTRICAL CENTER AND METHOD OF MANUFACTURING SAME

(71) Applicant: Aptiv Technologies Limited, St. Michael (BB)

(72) Inventors: Naiki A. Reynoso Galvan, Chihuahua (MX); Rodrigo Villanueva Ponce, Chihuahua (MX); Christopher Alan Brandon, El Paso, TX (US)

(73) Assignee: APTIV TECHNOLOGIES LIMITED (BB)

( * ) Notice: Subject to any disclaimer, the term of this patent is extended or adjusted under 35 U.S.C. 154(b) by 0 days.

(21) Appl. No.: 15/723,245

(22) Filed: Oct. 3, 2017

(65) Prior Publication Data
US 2019/0104622 A1   Apr. 4, 2019

(51) Int. Cl.
*H05K 5/00* (2006.01)
*H01R 12/58* (2011.01)
(Continued)

(52) U.S. Cl.
CPC ........... *H05K 5/0069* (2013.01); *B60R 16/03* (2013.01); *H01R 12/58* (2013.01); *H01R 43/205* (2013.01);
(Continued)

(58) Field of Classification Search
CPC ........ H01R 12/58; H01R 43/205; H05K 1/11; H05K 1/18; B60R 16/03
See application file for complete search history.

(56) References Cited

U.S. PATENT DOCUMENTS 6,075,708 A * 6/2000 Nakamura ............. H05K 1/141
361/743
6,520,789 B2 * 2/2003 Daugherty, Jr. ....... H01R 9/096
439/329
(Continued)

FOREIGN PATENT DOCUMENTS

EP       701924 A2    3/1996
EP       735622 A2   10/1996
(Continued)

OTHER PUBLICATIONS

European Search Report for Appl. No. 18198057, European Patent Office, dated Feb. 21, 2019.

*Primary Examiner* — Hoa C Nguyen
*Assistant Examiner* — Keith DePew
(74) *Attorney, Agent, or Firm* — Robert J. Myers (57) ABSTRACT

An electrical center for distributing electrical power to an electrical system of a vehicle and a method of manufacture the same is described herein. The electrical center includes a printed circuit board structure having a first printed circuit board (PCB) section angularly arranged with respect to a second PCB section. The printed circuit board structure includes a flexible connection element integrally formed with the first and second PCB sections forming a printed circuit extending from the first to second PCB section. The electrical center also includes a first plurality of electrical terminals extending perpendicularly from a first major surface of the first PCB section and a second plurality of electrical terminals extending perpendicularly from a second major surface of the second PCB section. The first major surface is angularly arranged at about a ninety degree angle relative to the second major surface.

12 Claims, 11 Drawing Sheets

(51) Int. Cl.
  *H01R 43/20* (2006.01)
  *H05K 1/18* (2006.01)
  *B60R 16/03* (2006.01)
  *H05K 1/11* (2006.01)

(52) U.S. Cl.
  CPC .............. *H05K 1/11* (2013.01); *H05K 1/18* (2013.01); *H05K 2201/091* (2013.01); *H05K 2201/10181* (2013.01)

(56) References Cited

U.S. PATENT DOCUMENTS

| | | | | |
|---|---|---|---|---|
| 9,474,149 | B2* | 10/2016 | Wolfel | H05K 1/0278 |
| 9,475,694 | B2* | 10/2016 | Martizon, Jr. | B81C 3/008 |
| 2002/0126462 | A1* | 9/2002 | Roussel | B60R 16/0238 |
| | | | | 361/760 |
| 2008/0180884 | A1 | 7/2008 | Parrish | |
| 2011/0045692 | A1 | 2/2011 | Westman et al. | |
| 2013/0095673 | A1* | 4/2013 | Brandon | H01R 12/58 |
| | | | | 439/55 |
| 2013/0194763 | A1 | 8/2013 | Yoon et al. | |
| 2014/0120749 | A1* | 5/2014 | Drew | H01R 12/71 |
| | | | | 439/78 |
| 2016/0006155 | A1* | 1/2016 | Trujillo | H01R 12/585 |
| | | | | 439/78 |
| 2016/0126706 | A1* | 5/2016 | Melchor Saucedo | |
| | | | | B60R 16/0238 |
| | | | | 361/626 |
| 2017/0181305 | A1* | 6/2017 | Morales | H05K 1/0366 |

FOREIGN PATENT DOCUMENTS

| | | |
|---|---|---|
| EP | 1201505 A2 | 5/2002 |
| WO | 9429145 A1 | 12/1994 |
| WO | 2016073064 A1 | 5/2016 |

\* cited by examiner

VEHICLE ELECTRICAL CENTER AND METHOD OF MANUFACTURING SAME

TECHNICAL FIELD OF INVENTION

This disclosure generally relates to an electrical center for distributing electrical power, and more particularly to an electrical center for distributing electrical power to an electrical system of a vehicle.

BACKGROUND OF THE INVENTION

An electrical center of a motor vehicle typically includes fuses to protect electrical components of the electrical system from damage caused by short circuits and/or circuit overload. A printed circuit board (PCB) based electrical center is a type of power distribution component assembly that mates to one or more wiring harness assemblies through a connection system interface. It provides complex internal power bussing, and contains devices such as fuses, relays, circuit breakers, and other electronic components, such as diodes and/or integrated circuit microcontrollers.

Traditionally electrical centers are configured with connector inputs/outputs and devices as a top/bottom assembly due to design and manufacturability limitations. Pin terminal headers which are typically utilized on electrical centers to create ninety degree angle connections consist of bent terminals assembled or terminals over-molded in plastic headers mated to the PCB. The assembly of the terminals to the PCB requires the plastic headers to be capable of withstanding high temperature soldering processes made of special high temperature plastics or requires special processing steps to avoid high temperature exposure of the plastic headers which may undesirably add cost to manufacturing the electrical center. Therefore, an electrical center assembly having 90 degree angle connections that eliminates the need for plastic headers remains desired.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with an embodiment of the invention, an electrical center for distributing electrical power to an electrical system of a vehicle is provided. The electrical center includes a printed circuit board structure having a first printed circuit board (PCB) section angularly arranged with respect to a second PCB section. The printed circuit board structure further includes a flexible connection element that is integrally formed with the first and second PCB sections which forms a printed circuit extending from the first PCB section to the second PCB section. The electrical center also includes a first plurality of electrical terminals extending perpendicularly from a first major surface of the first PCB section and a second plurality of electrical terminals extending perpendicularly from a second major surface of the second PCB section. The electrical center further includes a housing in which the printed circuit board structure is disposed. The first major surface is angularly arranged at about a ninety degree angle relative to the second major surface.

A portion of the first plurality of electrical terminals may be configured to interface with removable electrical components such as fusible links and/or electromechanical relays. A portion of the second plurality of electrical terminals may be male blade terminals that are configured to interface with an electrical connector containing corresponding female terminals. In alternative embodiments, the first plurality of terminals may include male blade terminals and the second plurality of terminals may include female terminals.

The electrical center may further include a shroud that is configured to receive the electrical connector. The shroud defines a plurality of apertures in which the second plurality of electrical terminals are received and through which the second plurality of electrical terminals extend.

The housing may define a pair of opposed parallel grooves in which opposed edges of the shroud are received. Additionally or alternatively, the shroud may be attached to the housing by a living hinge.

In accordance with another embodiment of the invention, method of manufacturing an electrical center configured to distribute electrical power to an electrical system of a vehicle is provided. The method includes the steps of:
providing a printed circuit board structure having a first printed circuit board
  (PCB) section angularly arranged with respect to a second PCB section and having a flexible connection element integrally formed with the first and second PCB sections and forming a printed circuit extending from the first PCB section to the second PCB section;
  inserting a first plurality of electrical terminals into a first major surface of the first PCB section such that the first plurality of electrical terminals extends perpendicularly from the first major surface;
  inserting a second plurality of electrical terminals into a second major surface of the second PCB section such that the second plurality of electrical terminals extends perpendicularly from the second major surface;
  bending the flexible connection element such that the first major surface is angularly arranged at about a ninety degree angle relative to the second major surface;
  providing a housing; and
  disposing the printed circuit board structure within the housing.

A portion of the first plurality of electrical terminals may be configured to interface with removable electrical components such as fusible links and/or electromechanical relays. A portion of the second plurality of electrical terminals may be male blade terminals that are configured to interface with an electrical connector containing corresponding female terminals.

The method may further include the steps of:
  providing a shroud configured to receive the electrical connector, wherein the shroud defines a plurality of apertures
  inserting the second plurality of electrical terminals within the plurality of apertures such that the second plurality of electrical terminals extend therethrough.

The housing may define a pair of opposed parallel grooves and the method may further include the step of disposing opposed edges of the shroud within the pair of opposed parallel grooves.

The shroud may be attached to the housing by a living hinge and the method may further include the step of folding the living hinge.

Further features and advantages will appear more clearly on a reading of the following detailed description of the preferred embodiment, which is given by way of non-limiting example only and with reference to the accompanying drawings.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

Figure 1:
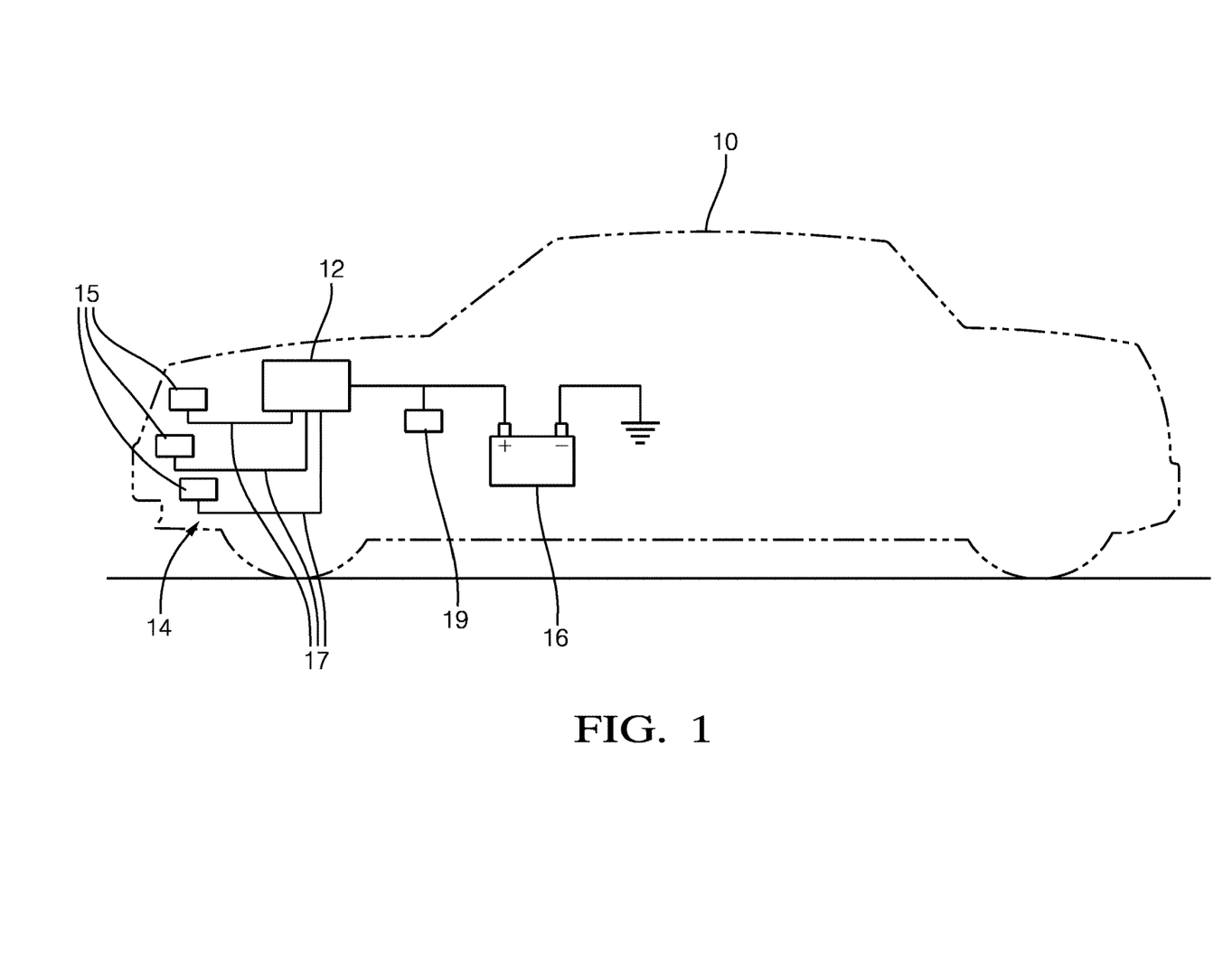
FIG. 1 is schematic diagram of a vehicle equipped with an electrical center according to an embodiment of the invention.

FIG. 1 illustrates a non-limiting example of a vehicle 10 equipped with an electrical center 12. The electrical center 12 distributes and limits the flow of electrical power to an electrical system 14 of the vehicle 10. The electrical system 14 typically includes various devices 15 of the vehicle 10, such as a horn, headlamps, power steering motor, etc., and the associated wiring harness 17 that is required to carry electrical power from the electrical center 12 to each of the devices 15. In general, the electrical center 12 receives electrical power from a battery 16 and an alternator 19 of the vehicle 10. The electrical center 12 limits the flow of electrical power being distributed to the electrical system 14 such that damage does not occur to the electrical system 14 as a result of a short circuit within the electrical system 14.

Figure 2:
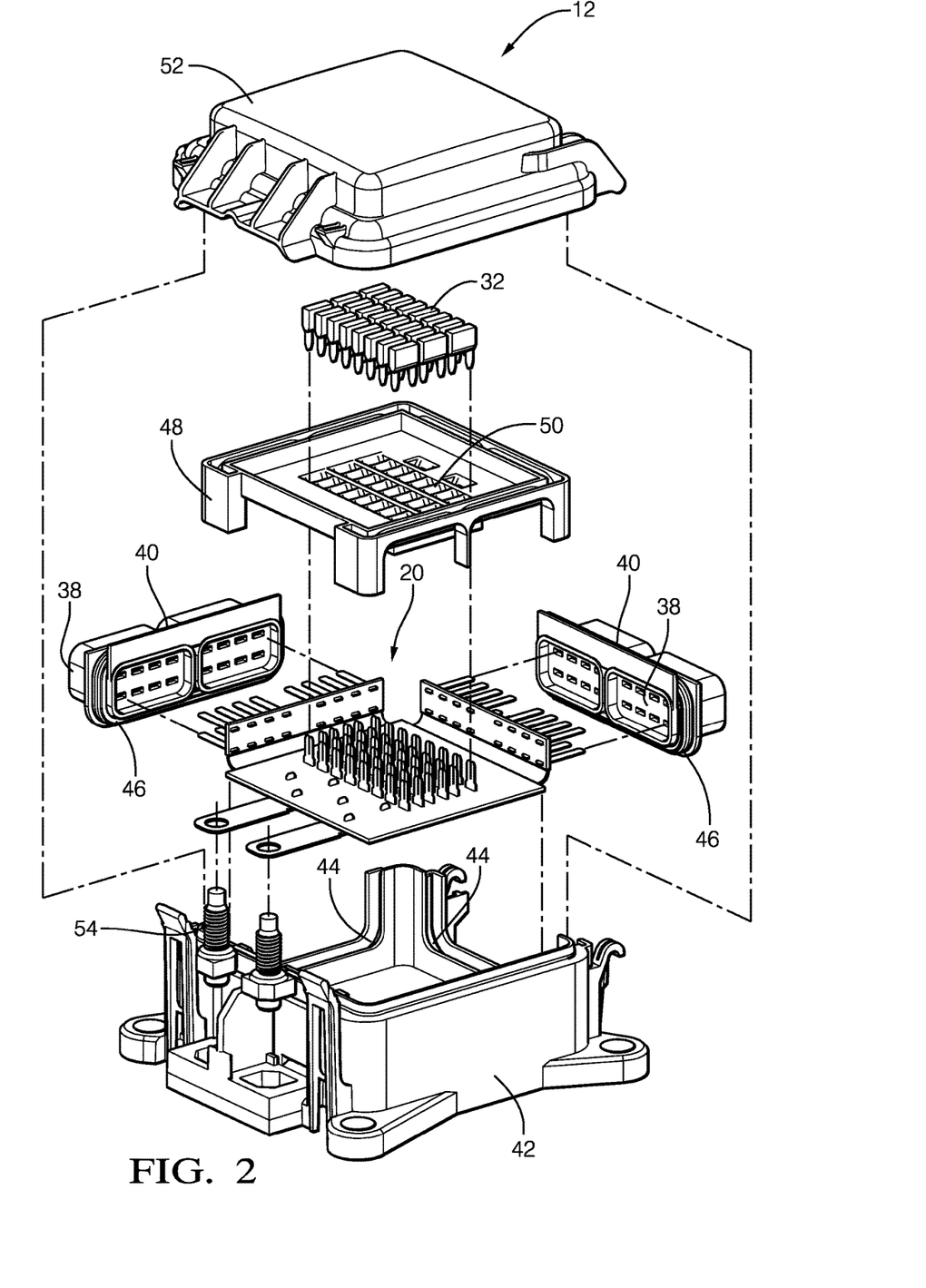
FIG. 2 is an exploded view of the electrical center according to an embodiment of the invention.
Figure 3:
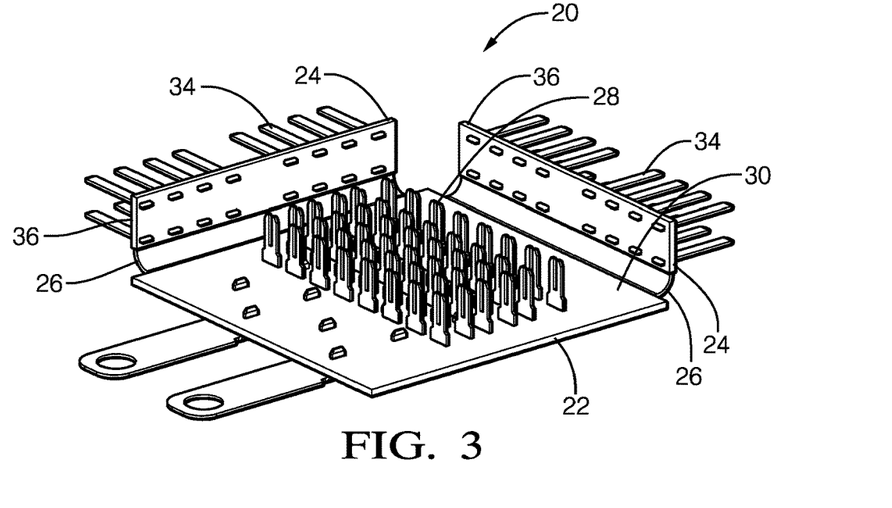
FIG. 3 is an isolated view of a printed circuit board structure of the electrical center of FIG. 2 according to an embodiment of the invention.
Figure 4:
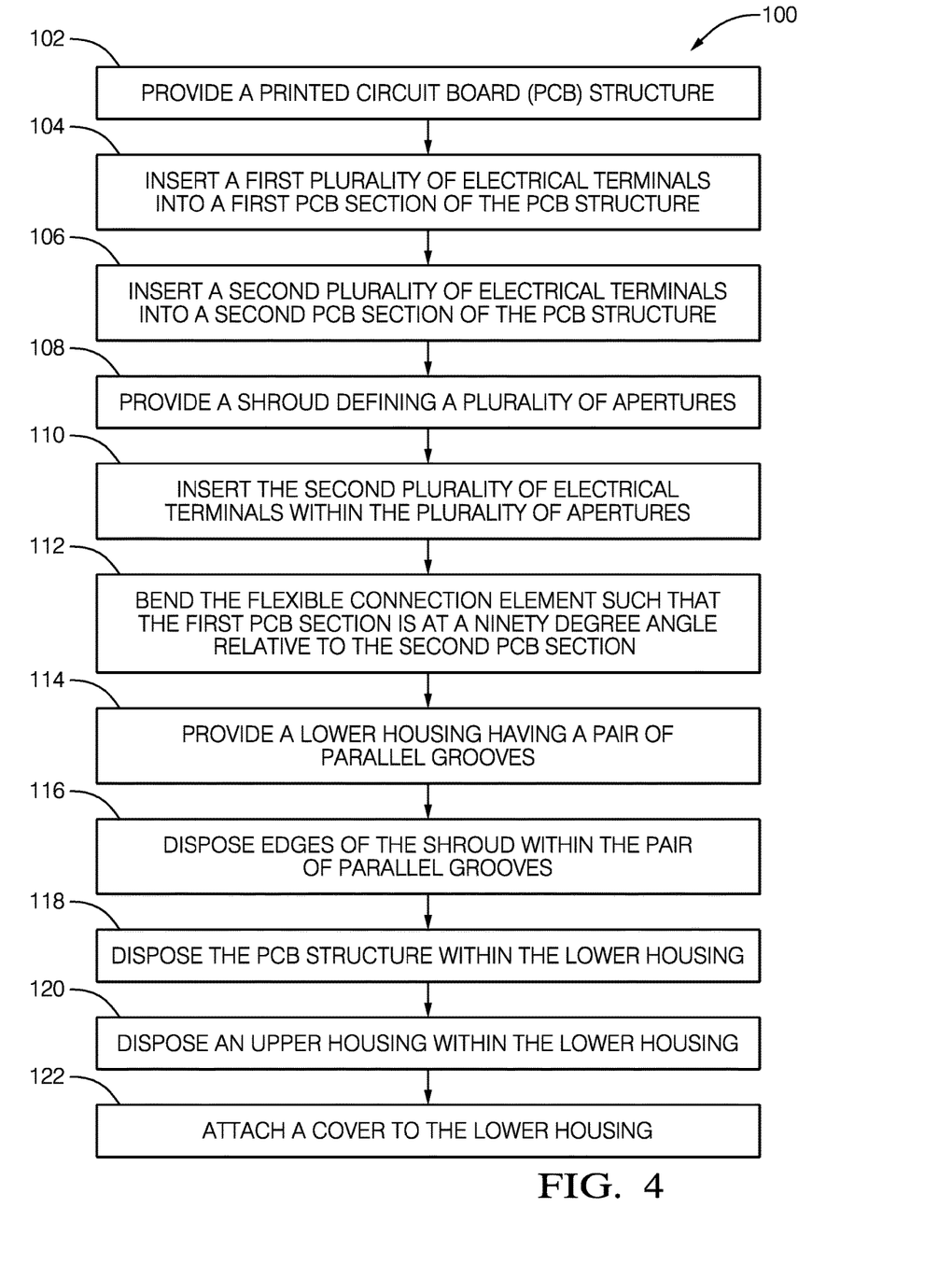
FIG. 4 is a flow chart of a method of manufacturing the electrical center of FIG. 2 according to an embodiment of the invention.

FIGS. 2 and 3 illustrate a non-limiting example of the electrical center 12. The electrical center 12 includes a printed circuit board structure 20 having a substantially rigid first printed circuit board (PCB) section 22 that is angularly arranged with respect to a substantially rigid second PCB section 24. A flexible connection element 26 is integrally formed with the first and second PCB sections 22, 24 and forms a printed circuit extending from the first PCB section 22 to the second PCB section 24. The first and second PCB sections 22, 24 do not include any contact pads that connect the first and second PCB sections 22, 24 to the flexible connection element 26.

As shown in FIGS. 2 and 3, a first plurality of electrical terminals 28 extend perpendicularly from a first major surface 30 of the first PCB section 22. A portion of the first plurality of electrical terminals 28 are configured to interface with removable fusible links 32. A second plurality of electrical terminals 34 extend perpendicularly from a second major surface 36 of the second PCB section 24. A portion of the second plurality of electrical terminals 34 are male blade terminals that are configured to interface with an electrical connector (not shown) containing corresponding female terminals. The flexible connection element 26 is folded such that the first major surface 30 of the first PCB section 22 is angularly arranged at about a ninety degree angle relative to the second major surface 36 of the second PCB section 24. As used herein "about a ninety degree angle" means an angle within a range of eight five to ninety five degrees.

As illustrated in FIG. 2, the electrical center 12 also includes a shroud 38 that is configured to receive the mating electrical connector. The shroud 38 defines a plurality of apertures 40 into which the second plurality of electrical terminals 34 are received and through which the second plurality of electrical terminals 34 extend.

The electrical center 12 further includes a lower housing 42 in which the printed circuit board structure 20 is disposed. The lower housing 42 is preferably made of an insulative plastic material, such as polybutylene terephthalate (PBT). The lower housing 42 defines a pair of opposed parallel grooves 44 that receive opposing edges 46 of the shroud to secure the second PCB section 24 at the ninety degree angle relative to the first PCB section 22.

The electrical center 12 additionally includes an upper housing 48 covering the first PCB section 22 defining a plurality of openings 50 allowing access to the first plurality of electrical terminals 28 and providing support for the fusible links 32 attached to the first plurality of electrical terminals 28. A removable cover 52 configured to allow access to the fusible links 32 is attached to the lower housing 42.

Figure 5:
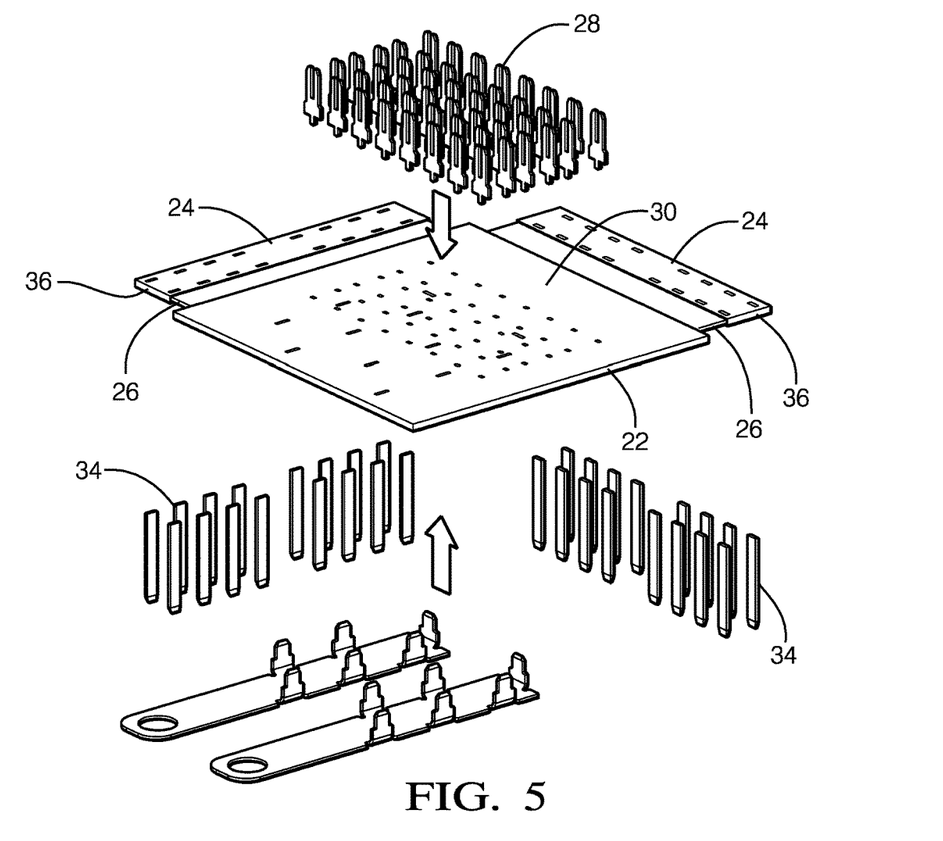
FIGS. 5 through 10 are progressive assembly views of the electrical center of FIG. 2 according to an embodiment of the invention.
Figure 6:
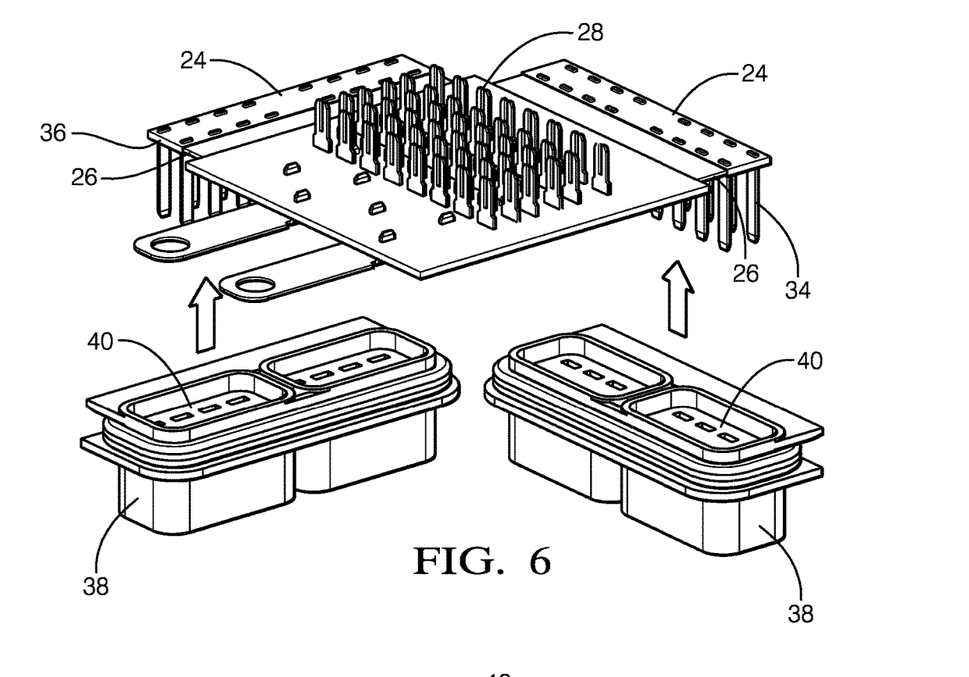
Figure 7:
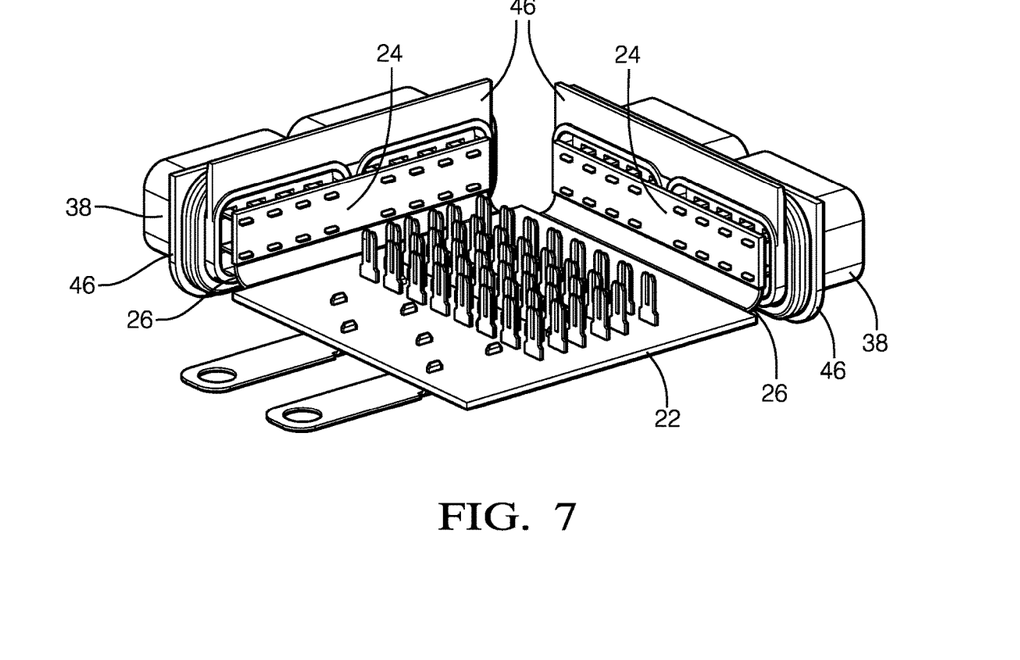

FIGS. 4 through 10 illustrate a non-limiting example of method 100 of manufacturing an electrical center 12 configured to distribute electrical power to an electrical system 14 of a vehicle 10. The method 100 includes the following steps:

STEP 102, PROVIDE A PRINTED CIRCUIT BOARD (PCB) STRUCTURE, includes providing a printed circuit board structure 20 having a first printed circuit board (PCB) section 22 and a second PCB section 24 interconnected by a flexible connection element 26 integrally formed with the first and second PCB sections 22, 24 and forming a printed circuit extending from the first PCB section 22 to the second PCB section 24. As illustrated in FIG. 5, the first major surface 30 of the first PCB section 22 is parallel to and co-planar with the second major surface 36 of the second PCB section 24;

STEP 104, INSERT A FIRST PLURALITY OF ELECTRICAL TERMINALS INTO A FIRST PCB SECTION OF THE PCB STRUCTURE, includes inserting a first plurality of electrical terminals 28 into a first major surface 30 of the first PCB section 22 such that the first plurality of electrical terminals 28 extends perpendicularly from the first major surface 30 as shown in FIGS. 5 and 6. A first portion of the first plurality of electrical terminals 28 are inserted into the top side of the first PCB section 22 and are configured to interface with removable fusible links 32 while a second portion of the first plurality of electrical terminals 28 are inserted into the bottom side of the first PCB section 22 and are configured to interface with treaded studs 54 (see FIG. 9);

STEP 106, INSERT A SECOND PLURALITY OF ELECTRICAL TERMINALS INTO A second PCB section 24 OF THE PCB STRUCTURE, includes inserting a second plurality of electrical terminals 34 into a second major surface 36 of the second PCB section 24 such that the second plurality of electrical terminals 34 extends perpendicularly from the second major surface 36 as illustrated in FIGS. 5 and 6. The second plurality of electrical terminals 34 are male blade terminals configured to interface with an electrical connector containing corresponding female terminals (not shown) and are inserted into the bottom side of the second PCB section 24;

STEP 108, PROVIDE A SHROUD DEFINING A PLURALITY OF APERTURES, includes providing a shroud 38 configured to receive the electrical connector, wherein the shroud 38 defines a plurality of apertures 40 as shown in FIG. 6;

STEP 110, INSERT THE SECOND PLURALITY OF ELECTRICAL TERMINALS WITHIN THE PLURALITY OF APERTURES, includes inserting the second plurality of electrical terminals 34 within the plurality of apertures 40 such that the second plurality of electrical terminals 34 extend therethrough as illustrated in FIG. 7.

Figure 8:
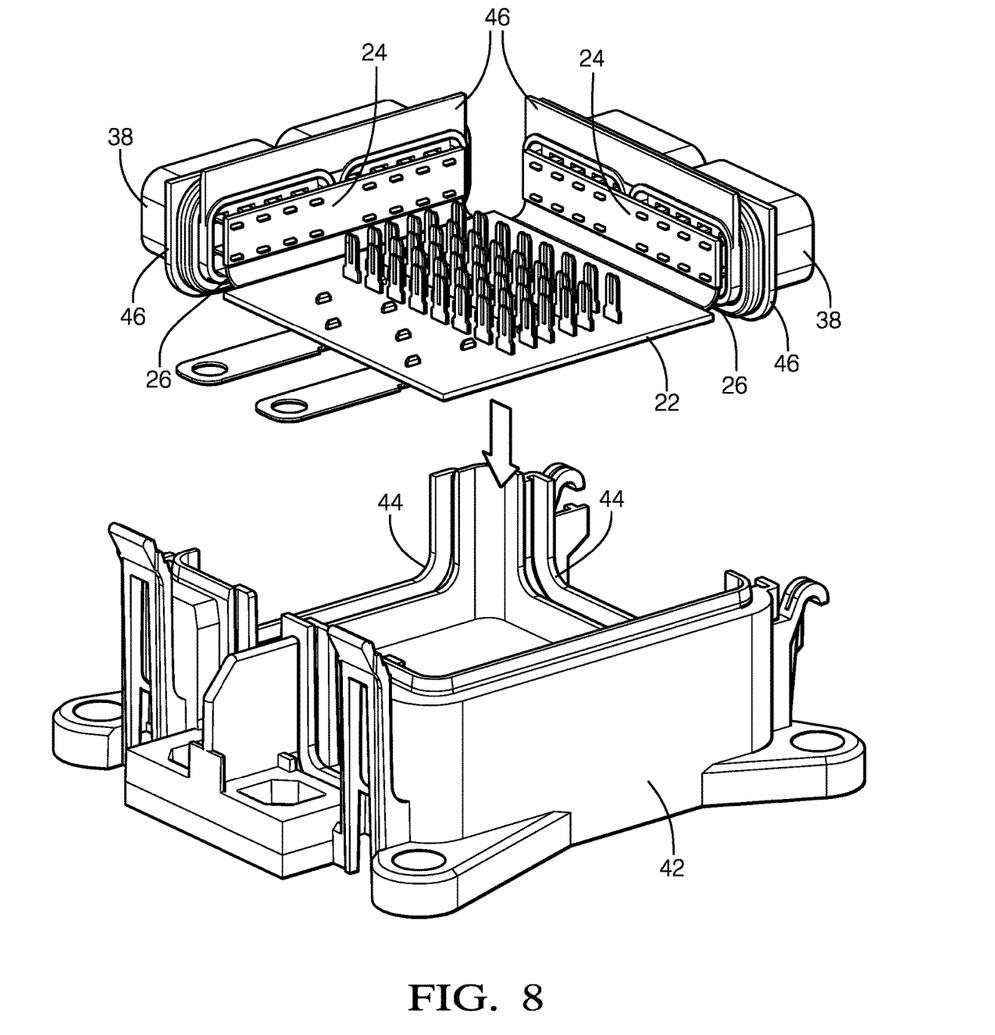
Figure 9:
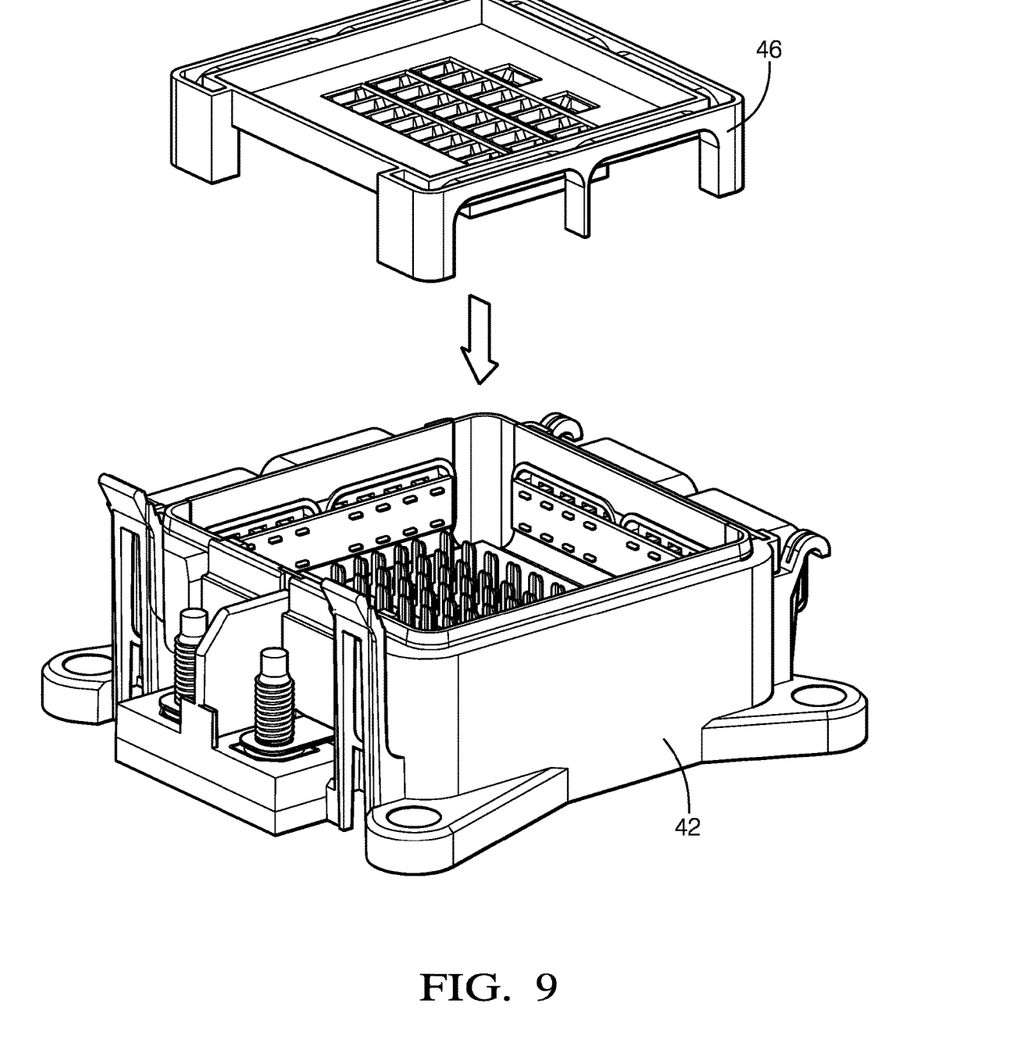
Figure 10:
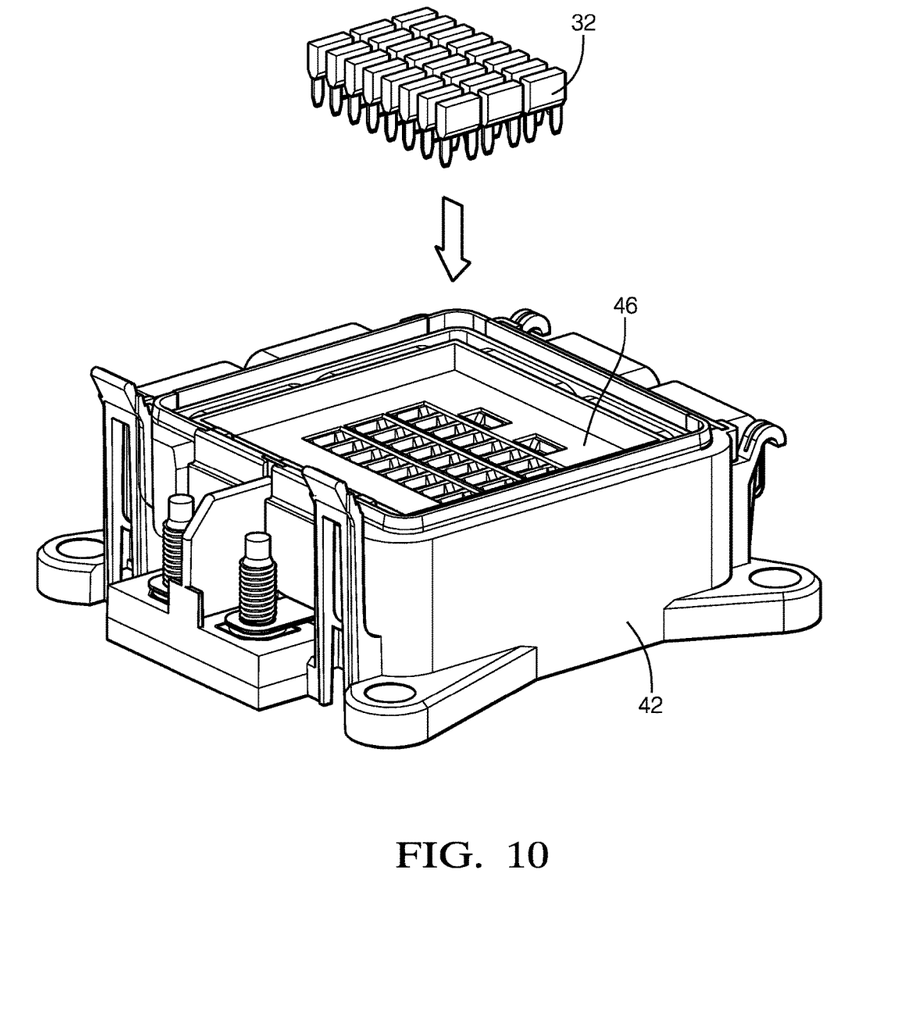

STEP 112, BEND THE FLEXIBLE CONNECTION ELEMENT SUCH THAT THE FIRST PCB SECTION IS AT A NINETY DEGREE ANGLE RELATIVE TO THE SECOND PCB SECTION, includes bending the flexible connection element 26 such that the first major surface 30 of the first PCB section 22 is angularly arranged at about a ninety degree angle relative to the second major surface 36 of the second PCB section 24 as illustrated in FIG. 7;

STEP 114, PROVIDE A LOWER HOUSING HAVING A PAIR OF PARALLEL GROOVES, includes providing a lower housing 42 defining a pair of opposed parallel grooves 44 as shown in FIG. 8;

STEP 116, DISPOSE EDGES OF THE SHROUD WITHIN THE PAIR OF PARALLEL GROOVES, includes disposing opposed edges of the shroud 38 within the pair of opposed parallel grooves 44 of the lower housing 42 as shown in FIGS. 8 and 9;

STEP 118, DISPOSE THE PCB STRUCTURE WITHIN THE LOWER HOUSING, includes disposing the printed circuit board structure 20 within the lower housing 42 as illustrated in FIGS. 8 and 9;

STEP 120, DISPOSE AN UPPER HOUSING WITHIN THE LOWER HOUSING, includes disposing an upper housing 48 within the lower housing 42 as illustrated in FIG. 10; and STEP 122, ATTACH A COVER TO THE LOWER HOUSING, includes attaching a cover 52 to the lower housing 42 as illustrated in FIG. 2.

Figure 11:
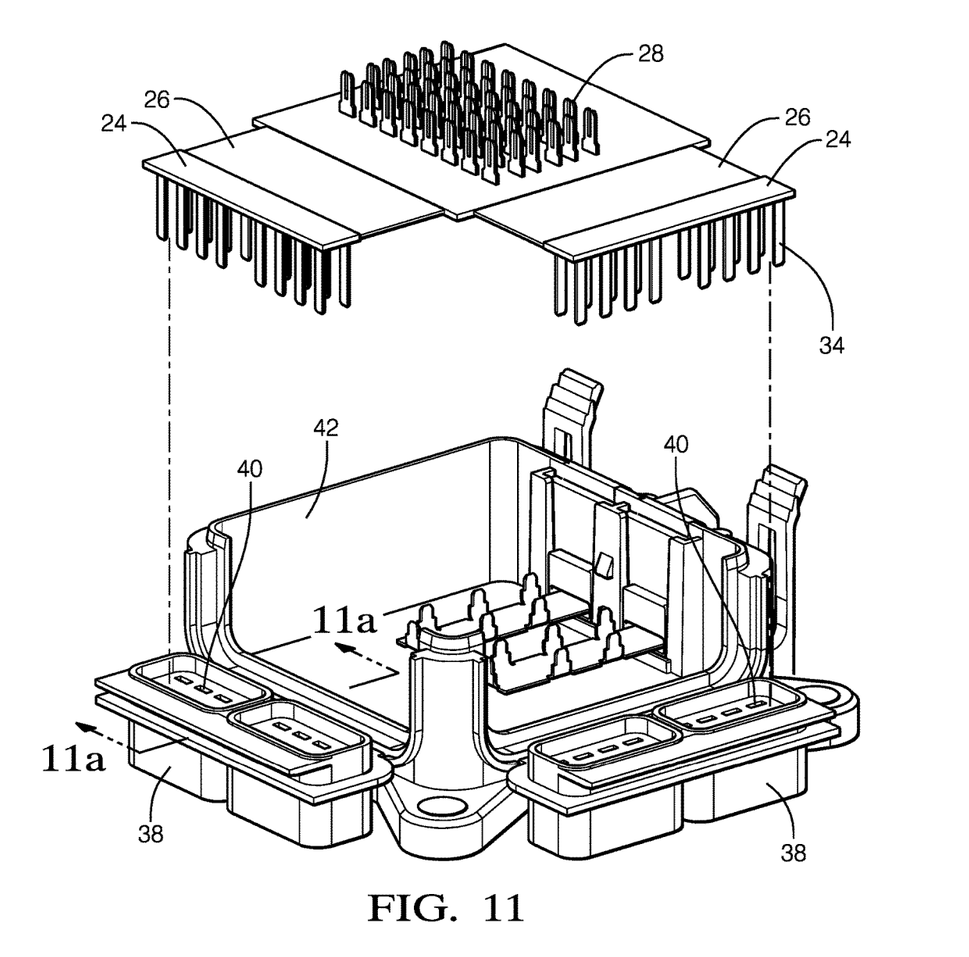
FIGS. 11 through 13 are progressive assembly views of an electrical center of according to another embodiment of the invention.
Figure 11A:
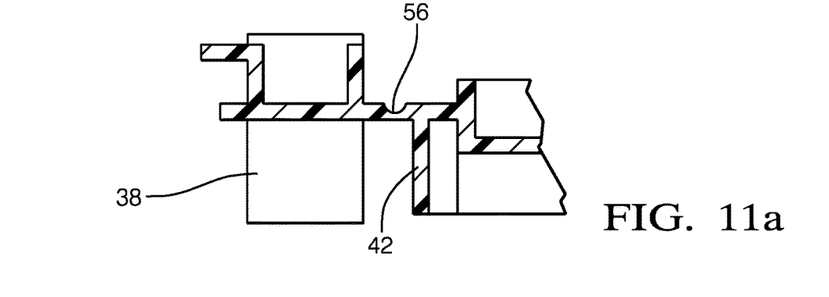
Figure 12:
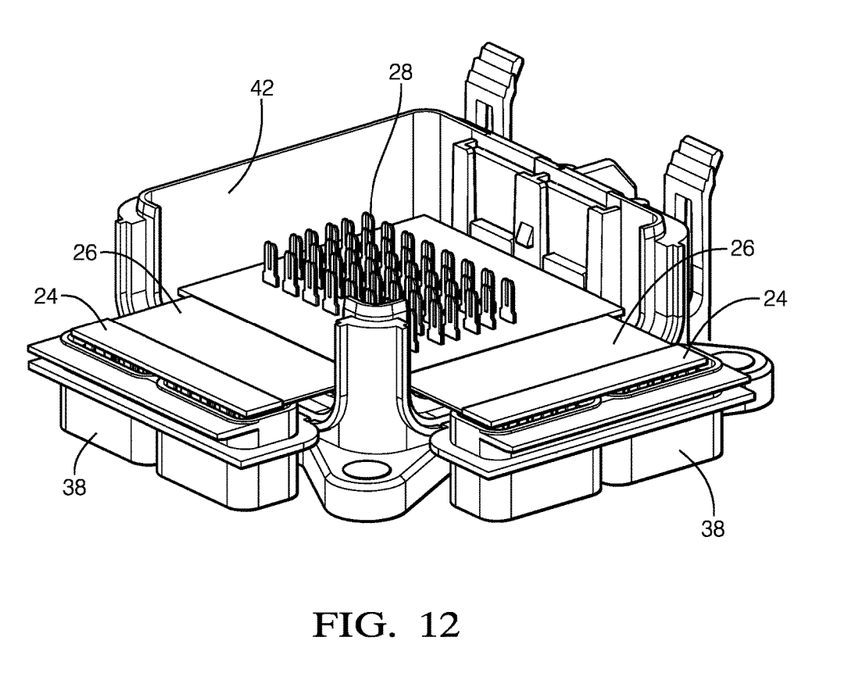
Figure 13:
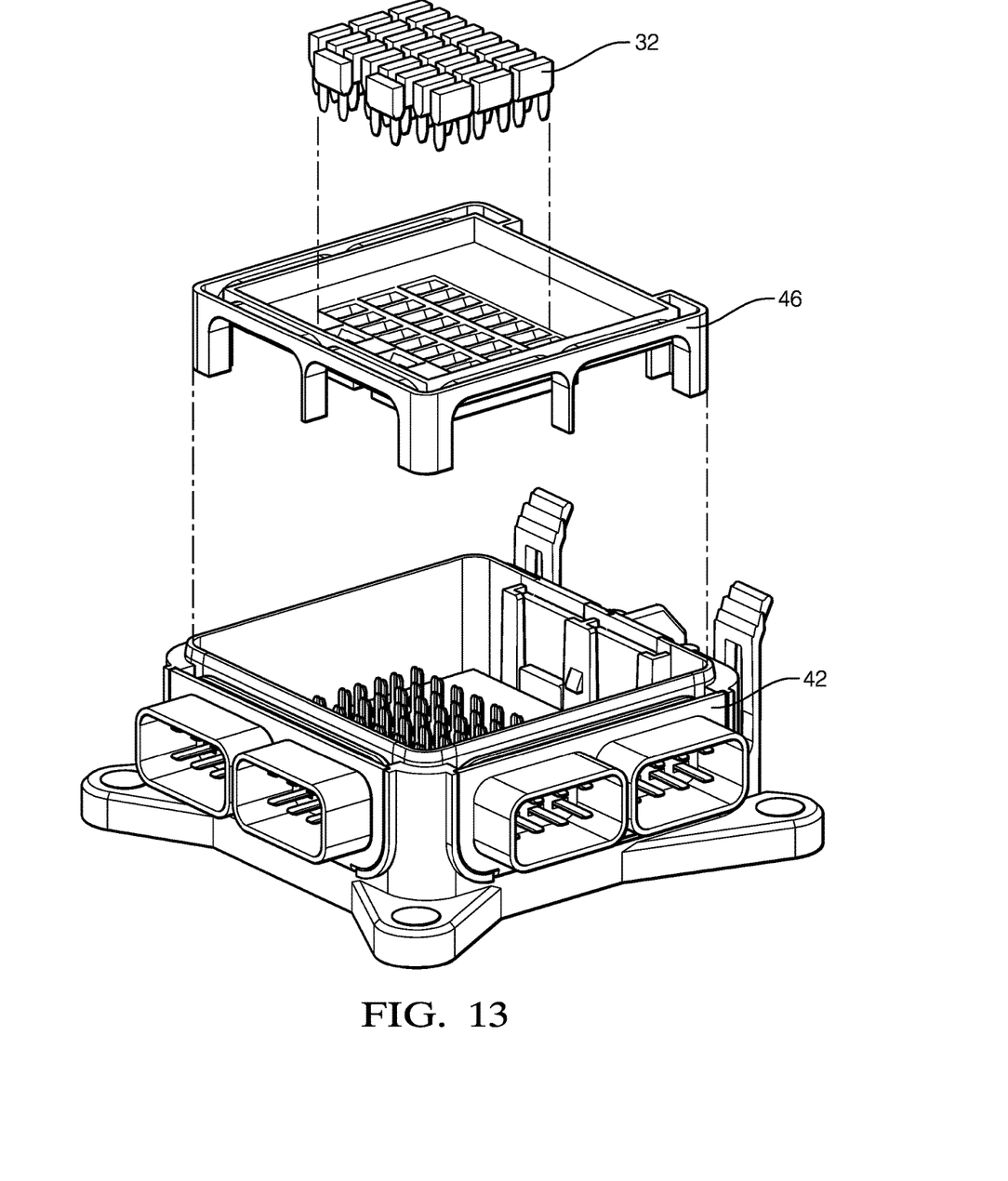

FIGS. 11-13 illustrate an alternative embodiment of the electrical center in which the shrouds 38 are attached to the lower housing 42 by a living hinge 56 as best shown in FIG. 11a. As shown in FIGS. 12 and 13, the living hinge 56 is folded during assembly of the electrical center.

Accordingly, an electrical center 12 for a vehicle 10 is provided. The flexible connection element 26 between the first and second PCB sections 22, 24 provides the electrical center 12 with terminals oriented along two different axes, e.g. top/bottom and left/right, allowing the optimization of the electrical center's design and packaging within the vehicle 10. With the introduction of the flexible connection element 26 into the electrical center 12, high current terminals can be positioned into multiple oriented interfaces, facilitating the assembly of harness connections and devices 15 rather than conventional top/bottom terminal orientation. Further benefits provided by the electrical center 12 includes utilization of current terminals on both the first PCB section 22 and the second PCB section 24. In addition, multiple configurations of the flexible connection element 26 potentially allows the reutilization of housing components for different electrical center 12 designs depending on electrical center 12 proliferation. The use of the flexible connection element 26 provides the reduction of components in the electrical center 12 including elimination of plastic headers, bent terminals, etc. The electrical center 12 additionally provides "right angle" header connectors/interfaces at final assembly without the need of plastic retrained right angle terminals being processed through high temperature terminal soldering processes.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

In the following claims, the terms "including" and "in which" are used as the plain-English equivalents of the respective terms "comprising" and "wherein." Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items. Additionally, directional terms such as upper, lower, etc. do not denote any particular orientation, but rather the terms upper, lower, etc. are used to distinguish one element from another and locational establish a relationship between the various elements.

Further, the limitations of the following claims are not written in means-plus-function format and are not intended to be interpreted based on 35 USC § 112(f), unless and until such claim limitations expressly use the phrase "means for" followed by a statement of function void of further structure.

We claim:
1. An electrical center configured to distribute electrical power to an electrical system of a vehicle, said electrical center comprising:
   a printed circuit board structure having a first printed circuit board (PCB) section angularly arranged with respect to a second PCB section and having a flexible connection element integrally formed with the first and second PCB sections and forming a printed circuit extending from the first PCB section to the second PCB section;
   a first plurality of electrical terminals extending perpendicularly from a first major surface of the first PCB section;
   a second plurality of electrical terminals extending perpendicularly from a second major surface of the second PCB section;

a housing in which the printed circuit board structure is disposed, wherein the first major surface is angularly arranged at about a ninety degree angle relative to the second major surface; and a shroud configured to receive the electrical connector, wherein the shroud defines a plurality of apertures in which the second plurality of electrical terminals are received and through which the second plurality of electrical terminals extend and wherein the housing defines a pair of opposed parallel grooves in which opposed edges of the shroud are received.

2. The electrical center according to claim 1, wherein a portion of the first plurality of electrical terminals are configured to interface with removable fusible links.

3. The electrical center according to claim 2, wherein a portion of the second plurality of electrical terminals are male blade terminals configured to interface with an electrical connector containing corresponding female terminals.

4. An electrical center configured to distribute electrical power to an electrical system of a vehicle, said electrical center comprising:

a printed circuit board structure having a first printed circuit board (PCB) section angularly arranged with respect to a second PCB section and having a flexible connection element integrally formed with the first and second PCB sections and forming a printed circuit extending from the first PCB section to the second PCB section;

a first plurality of electrical terminals extending perpendicularly from a first major surface of the first PCB section;

a second plurality of electrical terminals extending perpendicularly from a second major surface of the second PCB section;

a housing in which the printed circuit board structure is disposed, wherein the first major surface is angularly arranged at about a ninety degree angle relative to the second major surface; and a shroud configured to receive the electrical connector, wherein the shroud defines a plurality of apertures in which the second plurality of electrical terminals are received and through which the second plurality of electrical terminals extend and wherein the shroud is attached to the housing by a living hinge.

5. The electrical center according to claim 4, wherein a portion of the first plurality of electrical terminals are configured to interface with removable fusible links.

6. The electrical center according to claim 4, wherein a portion of the second plurality of electrical terminals are male blade terminals configured to interface with an electrical connector containing corresponding female terminals.

7. A method of manufacturing an electrical center configured to distribute electrical power to an electrical system of a vehicle, said method comprising the steps of:

providing a printed circuit board structure having a first printed circuit board (PCB) section angularly arranged with respect to a second PCB section and having a flexible connection element integrally formed with the first and second PCB sections and forming a printed circuit extending from the first PCB section to the second PCB section;

inserting a first plurality of electrical terminals into a first major surface of the first PCB section such that the first plurality of electrical terminals extends perpendicularly from the first major surface;

inserting a second plurality of electrical terminals into a second major surface of the second PCB section such that the second plurality of electrical terminals extends perpendicularly from the second major surface;

bending the flexible connection element such that the first major surface is angularly arranged at about a ninety degree angle relative to the second major surface;

providing a shroud configured to receive the electrical connector, wherein the shroud defines a plurality of apertures;

inserting the second plurality of electrical terminals within the plurality of apertures such that the second plurality of electrical terminals extend therethrough;

providing a housing, wherein the housing defines a pair of opposed parallel grooves;

disposing opposed edges of the shroud within the pair of opposed parallel grooves; and disposing the printed circuit board structure within the housing.

8. The method according to claim 7, wherein a portion of the first plurality of electrical terminals are configured to interface with removable fusible links.

9. The method according to claim 7, wherein a portion of the second plurality of electrical terminals are male blade terminals configured to interface with an electrical connector containing corresponding female terminals.

10. A method of manufacturing an electrical center configured to distribute electrical power to an electrical system of a vehicle, said method comprising the steps of:

providing a printed circuit board structure having a first printed circuit board (PCB) section angularly arranged with respect to a second PCB section and having a flexible connection element integrally formed with the first and second PCB sections and forming a printed circuit extending from the first PCB section to the second PCB section;

inserting a first plurality of electrical terminals into a first major surface of the first PCB section such that the first plurality of electrical terminals extends perpendicularly from the first major surface;

inserting a second plurality of electrical terminals into a second major surface of the second PCB section such that the second plurality of electrical terminals extends perpendicularly from the second major surface;

bending the flexible connection element such that the first major surface is angularly arranged at about a ninety degree angle relative to the second major surface;

providing a shroud configured to receive the electrical connector, wherein the shroud defines a plurality of apertures;

inserting the second plurality of electrical terminals within the plurality of apertures such that the second plurality of electrical terminals extend therethrough;

providing a housing, wherein the shroud is attached to the housing by a living hinge;

folding the living hinge; and disposing the printed circuit board structure within the housing.

11. The method according to claim 10, wherein a portion of the first plurality of electrical terminals are configured to interface with removable fusible links.

12. The method according to claim 10, wherein a portion of the second plurality of electrical terminals are male blade terminals configured to interface with an electrical connector containing corresponding female terminals.

* * * * *